United States Patent [19]

Gunning, III et al.

[11] Patent Number: 5,638,197

[45] Date of Patent: Jun. 10, 1997

[54] INORGANIC THIN FILM COMPENSATOR FOR IMPROVED GRAY SCALE PERFORMANCE IN TWISTED NEMATIC LIQUID CRYSTAL DISPLAYS AND METHOD OF MAKING

[75] Inventors: William J. Gunning, III, Newbury Park; Bruce K. Winker, Moorpark; Donald B. Taber, Thousand Oaks; Paul H. Kobrin, Newbury Park; James C. Beedy, Ventura; John P. Eblen, Jr., Newbury Park, all of Calif.

[73] Assignee: Rockwell International Corp., Seal Beach, Calif.

[21] Appl. No.: 313,510

[22] Filed: Sep. 30, 1994

Related U.S. Application Data

[63] Continuation-in-part of Ser. No. 223,251, Apr. 4, 1994, Pat. No. 5,504,603.

[51] Int. Cl.$^6$ .................................................. G02F 1/1335
[52] U.S. Cl. ............................................ 349/96; 349/117
[58] Field of Search ........................................ 359/73, 63

[56] References Cited

U.S. PATENT DOCUMENTS

| | | | |
|---|---|---|---|
| 4,701,028 | 10/1987 | Clerc et al. | 359/73 |
| 4,813,768 | 3/1989 | Hamaguchi et al. | 359/73 |
| 4,874,664 | 10/1989 | Hamaguchi et al. | 428/325 |
| 5,189,538 | 2/1993 | Arakawa | 359/93 |
| 5,194,975 | 3/1993 | Akatsuka et al. | 359/63 |
| 5,196,953 | 3/1993 | Yeh et al. | 359/73 |
| 5,305,143 | 4/1994 | Taga et al. | 359/490 |
| 5,375,006 | 12/1994 | Haas | 359/63 |

FOREIGN PATENT DOCUMENTS

| | | | |
|---|---|---|---|
| 0 576 304 A1 | 12/1993 | European Pat. Off. | |
| 6-174920 | 6/1994 | Japan | 359/73 |

OTHER PUBLICATIONS

J. M. Nieuwenhuizen and H. B. Haanstra, "Microfractography of thin films", Philips Technical Review, vol., No. 3/4, pp. 87–91, 1966.

H. A. Macleod, "Thin–Film Optical Filters", Macmillan Publishing Co, pp. 357–411, 1987.H.

Kumaya, Yamamoto, Fujimura, and Umemoto, "A Display Substrate, A Method for Manufacturing Said Substrate, and a Liquid Crystal Display Element Using Said Substrate," Japan Patent Application No. 3–114023, filed Sep. 20, 1989.

Horowitz, "Structure–Induced Optical Anisotropy in Thin Films," Ph.D. Dissertation, University of Arizona, 1983.

Kahn, "The Molecular Physics of Liquid–Crystal Devices," Physics Today, pp. 66–74, May 1982.

Macleod, Structure–related Optical Properties of Thin Films, J. Vac. Sci. Technol. A, vol. 4, No. 3, pp. 418–422, 1986.

Stoner, "The Demagnetizing Factor For Ellipsoids," Phil. Mag., vol. 36, pp. 803–821, 1945.

Wu and Hodgkinson, "Materials for Birefringent Coatings," Optics and Photonics News, vol. 5, No. 5, insert, 1994.

Hamaguchi, "Phase Compensation Plate," Patent Abstracts of Japan, vol. 14, No. 301, 1990, p. 1069.

Hodgkinson et al., "Measurement of the Principal Refractive Indices of Thin Films Deposited at Oblique Incidence," J. Opt. Soc. Am. A, vol. 2, No. 10, 1985, pp. 1693–1697.

Motohiro et al., "Thin Film Retardation Plate By Oblique Deposition," Applied Optics, vol. 28, No. 13, 1989, pp. 2466–2482.

*Primary Examiner*—Anita Pellman Gross
*Assistant Examiner*—Walter J. Malinowski
*Attorney, Agent, or Firm*—Gregory G. Williams; M. Lee Murrah; George A. Montanye

[57] ABSTRACT

An optical O-plate compensation device, in accordance with the invention, uses an inorganic thin film which is grown by physical vapor deposition at oblique incidence. The resulting thin film exhibits a biaxial form birefringence and performs, in a liquid crystal display (LCD), in a similar manner to uniaxial films with its extraordinary axis oriented obliquely at about 45° with respect to the surface of the film. The invention makes possible a significant improvement in the gray scale properties and contrast ratios of liquid crystal displays (LCDs) over a wide range of viewing angles.

23 Claims, 16 Drawing Sheets

INORGANIC THIN FILM COMPENSATOR FOR IMPROVED GRAY SCALE PERFORMANCE IN TWISTED NEMATIC LIQUID CRYSTAL DISPLAYS AND METHOD OF MAKING

CROSS-REFERENCES TO RELATED APPLICATIONS

This is a continuation-in-part application of U.S. patent application, Ser. No. 08/223,251 now U.S. Pat. No. 5,504,603, filed Apr. 4, 1994, entitled "Optical Compensator for proved Gray Scale Perforate Liquid Crystal Display."

BACKGROUND OF THE INVENTION

1. Field of the Invention

This invention is concerned with the design of liquid crystal displays (LCDs) and, more particularly, with techniques for maximizing the field of view of such displays by maintaining a high contrast ratio and minimal variance in relative gray levels over a wide range of viewing angles. These goals are achieved through the fabrication and manufacture of LCDs using O-plate compensator technology.

2. Description of the Prior Art

LCD Technology Overview

Liquid crystals are useful for electronic displays because polarized light traveling through a liquid crystal layer is affected by the layer's birefringence, which can be changed by the application of a voltage across the layer. By using this effect, the transmission or reflection of light from an external source, including ambient light, can be controlled with much less power than is required for the luminescent materials used in other types of displays. As a result, liquid crystal displays are now commonly used in a wide variety of applications, such as, for example, digital watches, calculators, portable computers, and many other types of electronic equipment. These applications highlight some of the advantages of LCD technology including very long operational life in combination with very low weight and low power consumption.

The information content in many liquid crystal displays is presented in the form of multiple rows of numerals or characters, which are generated by segmented electrodes deposited in a pattern on the display. The electrode segments are connected by individual leads to electronic driving circuitry. By applying a voltage to the appropriate combination of segments, the electronic driving circuitry controls the light transmitted through the segments.

Graphic and television displays may be achieved by employing a matrix of pixels in the display which are connected by an X-Y sequential addressing scheme between two sets of perpendicular conductors. More advanced addressing schemes, applied predominantly to twisted nematic liquid crystal displays, use arrays of thin film transistors to control driving voltages at the individual pixels.

Contrast and stability of relative gray scale intensities are important attributes in determining the quality of a liquid crystal display. The primary factor limiting the contrast achievable in a liquid crystal display is the amount of light which leaks through the display in the dark state. In addition, the contrast ratio of the liquid crystal device also depends on the viewing angle. The contrast ratio in a typical liquid crystal display is a maximum only within a narrow viewing angle centered near normal incidence and drops off as the angle of view is increased. This loss of contrast ratio is caused by light leaking through the black state pixel elements at large viewing angles. In color liquid crystal displays, such leakage also causes severe color shifts for both saturated and gray scale colors.

The viewing zone of acceptable gray scale stability in a typical prior art twisted nematic liquid crystal display is severely limited because, in addition to color shifts caused by dark state leakage, the optical anisotropy of the liquid crystal molecules results in large variations in gray level transmission, i.e., a shift in the brightness-voltage curve, as a function of viewing angle. The variation is often severe enough that, at extreme vertical angles, some of the gray levels reverse their transmission levels. These limitations are particularly important for applications requiring a very high quality display, such as in avionics, where viewing of cockpit displays from both pilot and copilot seating positions is important. Such high information content displays require that the relative gray level transmission be as invariant as possible with respect to viewing angle. It would be a significant improvement in the art to provide a liquid crystal display capable of presenting a high quality, high contrast image over a wide field of view.

FIGS. 1a and 1b show a conventional normally, white, twisted nematic liquid crystal display 100 including a polarizer 105, an analyzer 110 with a polarization axis perpendicular to that of the polarizer 105, a light source 130, and a viewer 135.

In the normally white configuration of FIGS. 1a and 1b, a "nonselect" area 115 (no applied voltage) appears light, while a "select" area 120 (those which are energized by an applied voltage) appear dark. In the select area 120 the liquid crystal molecules tend to tilt and rotate toward alignment with the applied electric field. If this alignment were perfect, all the liquid crystal molecules in the cell would be oriented with their long axes normal to the cell's major surface. This alignment is referred to as homeotropic.

Because the liquid crystals used for twisted nematic displays exhibit positive birefringence, this arrangement, known as the homeotropic configuration, would exhibit the optical symmetry of a positively birefringent C-plate. As is well known in the art, a C-plate is a uniaxial birefringent plate with its extraordinary axis (i.e., its optic or c-axis) perpendicular to the surface of the plate (parallel to the direction of normally incident light). In the select state the liquid crystal in a normally white display would thus appear isotropic to normally incident light, which would be blocked by the crossed polarizers.

One reason for the loss of contrast with increased viewing angle which occurs in a normally white display is that a homeotropic liquid crystal layer will not appear isotropic to off-normal light. Light propagating through the layer at off-normal angles appears in two modes due to the birefringence of the layer; a phase delay is introduced between those modes and increases with the incident angle of the light. This phase dependence on incidence angle introduces an ellipticity to the polarization state which is incompletely extinguished by the second polarizer, giving rise to light leakage. To correct for this effect, an optical compensating element must also have C-plate symmetry, but with negative birefringence ($n_e < n_o$). Such a compensator will introduce a phase delay opposite in sign to the phase delay caused by the liquid crystal layer, thereby restoring the original polarization state and allowing light passing through energized areas of the layer to be blocked more completely by the output polarizer. C-plate compensation, however, does not impact the variation of gray scale with viewing angle, which is addressed by the present invention.

FIG. 2 depicts the coordinate system which is used to describe the orientation of both liquid crystal and birefringent compensator optic axes. Light propagates toward the viewer 200 in the positive z direction 205 which, together with the x-axis 210 and the y-axis 215, form a right-handed coordinate system. Backlighting is provided, as indicated by the arrows 220, from the negative z direction. The polar tilt angle Θ 225 is defined as the angle between the liquid crystal's molecular optic axis ĉ 230 and the x-y plane, measured from the x-y plane. The azimuthal or twist angle Φ 235 is measured from the x-axis to the projection 240 of the optic axis into the x-y plane.

Normally White Twisted Nematic LCDs

FIG. 3 is a cross sectional schematic view of a prior art twisted nematic, transmissive type normally white liquid crystal display. The display includes a polarizer layer 300 and an analyzer layer 305, between which is positioned a liquid crystal layer 310, consisting of a liquid crystal material in the nematic phase.

It is convenient in describing the orientation of various compensation elements of the display to refer to a normal axis perpendicular to the display, which is depicted by a dashed line 370. In the case of a normally white display, the polarizer 300 (with a polarization direction in the plane of the drawing 315) and the analyzer 305 (with a polarization direction into the plane of the drawing 320) are oriented with their polarization directions at 90° to one another. (A polarizer 300 and an analyzer 305 both polarize electromagnetic fields. Typically, however, the term 'polarizer' refers to a polarizer element that is closest the source of light while the term 'analyzer' refers to a polarizer element that is closest the viewer of the LCD.) A first transparent electrode 325 and a second transparent electrode 330 are positioned on the glass plates 340 and 345 adjacent to opposite surfaces of the liquid crystal layer 310 so that a voltage can be applied, by means of a voltage source 335, across the liquid crystal layer. As is explained below, the inner surfaces of the glass plates 340 and 345, which are proximate to the liquid crystal layer 310, can be physically or chemically treated to affect the desired liquid crystal orientation, as by buffing.

As is well known in the LCD art (see, e.g., Kahn, "The Molecular Physics of Liquid-Crystal Devices," Physics Today, pp. 66–74, May 1982), when the inner surfaces of the plates 340 and 345 (the surfaces adjacent to the layer 310) are coated with a surface treatment for aligning the liquid crystal such as polyimide, buffed, and oriented with their buffed directions perpendicular, the director of the liquid crystal material, absent any applied electrical voltage, will tend to align with the buffed direction (known as the "rub direction") in the regions of the layer 310 proximate each of the plates 340 and 345. Furthermore, the orientation of the liquid crystal axis (i.e., the director) will twist smoothly with respect to the normal axis through an angle of 90° along a path in the layer 310 from the first major surface adjacent to the plate 340 (i.e., at the 310/340 interface) to the second major surface adjacent to the plate 345 (i.e., at the 310/345 interface).

In the absence of an applied electric field the direction of polarization of incoming polarized light will be rotated by 90° in traveling through the liquid crystal layer. When the glass plates and the liquid crystal layer are placed between crossed polarizers, such as the polarizer 300 and the analyzer 305, light polarized by the polarizer and traversing the display, as exemplified by the light ray 350, will thus be aligned with the polarization direction of the analyzer 320 and therefore will pass through the analyzer.

When a sufficient voltage is applied to the electrodes 325 and 330, however, the applied electric field causes the director of the liquid crystal material to tend to align parallel to the field. With the liquid crystal material in this state, light passed by the polarizer 300, as illustrated by the light ray 355, will be extinguished by the analyzer 305. Thus, an energized pair of electrodes will produce a dark region in the display, while light passing through regions of the display which are not subject to an applied field will produce illuminated regions. As is well known in the LCD display art, an appropriate pattern of electrodes, activated in selected combinations, can be utilized in this manner to display alphanumeric or graphic information. As explained further below, one or more compensator layers, such as the layers 360 and 365, may be included in the display to improve the quality of the display.

Normally White Twisted Nematic LCD Characteristics

FIG. 4 shows a calculated plot of liquid crystal director tilt as a function of position in a liquid crystal layer (where the cell gap has been normalized to unity) in a 90° twisted nematic cell. Typical distributions for molecular tilt angles when no voltage is applied (curve 400), under a typical select state voltage (curve 405), and under the application of several intermediate voltages chosen to yield linearly spaced gray levels (curves 410, 415, 420, 425, 430, and 435) are shown.

FIG. 5 is a related plot for the same cell depicting the calculated twist angle of the liquid crystal molecules as a function of position in the cell. When there is no applied voltage, the twist is distributed evenly throughout the cell (straight line curve 500). Under a fully select state voltage, the twist is distributed as shown by the external, S-shaped curve 505. The twist distributions for gray levels are shown by the intermediate curves between the two curves 500 and 505.

As illustrated by FIGS. 4 and 5, when the fully selected voltage is applied nearly all of the twist experienced by the liquid crystal molecules, and a substantial portion of the tilt, occurs in the central region of the cell. Because of this phenomenon, the continuous variation of molecular orientation within the cell can be separated into three regions, each of which is characterized by its own optical symmetry. Thus, the central regions 440 (FIG. 4) and 510 (FIG. 5) can be considered as nominally homeotropic in the fully selected state, approximating the properties of a C-plate. The regions 445 and 450 (FIG. 4) and 515 and 520 (FIG. 5), near each surface of the cell, behave as A-plates, each with its extraordinary axis aligned with the rub direction of the proximate substrate. Because there is essentially no twist in the molecules in the regions 445, 450, 515, and 520, the molecules are essentially aligned with the respective rub directions on either side of the liquid crystal layer. In addition, because the twist angle of the molecules in the regions 445 and 515 tends to be perpendicular to the twist angle of the molecules in the regions 450 and 520, the effect of these two regions on light traveling through the cell tends to be canceled, leaving the middle C-plate region to exert the dominant influence.

C-Plate Compensation

As is well known in the art, a negative C-plate compensator is designed to correct for the angle dependent phase shift introduced by propagation through the central, approximately C-plate region of a LCD cell. Such a compensator is effective to the extent that the optical symmetry of the central region dominates the selected state of the liquid crystal cell, that is, the extent to which the molecules align with the applied field. This implies that negative C-plate compensation will work best when strong fields are used for the energized state as this makes the homeotropic approximation more nearly correct. The use of a C-plate has been demonstrated to significantly reduce the leakage of the dark state over an extended field of view, thus improving contrast and reducing color desaturation.

Gray Scale Stability

While a C-plate compensator may be used to improve contrast, it does not improve gray scale stability. The problem of maintaining constant gray scale luminance differences over the field of view relates substantially to the brightness level changes for levels assigned between the select (black for a normally white display) and nonselect (white for a normally white display) states. This phenomenon is generally depicted using transmission, or brightness, versus voltage (BV) electro-optic response curves for a display to which eight gray levels are assigned, from level 0 (the select black state) to level 7 (the nonselect white state). Gray levels between 0 and 7 are chosen by assigning them a set of voltages spaced linearly in brightness along the BV curve between the select and nonselect voltages.

FIG. 6 is a plot of calculated BV (transmission versus drive voltage) curves for a normally white, 90° twisted nematic display as the horizontal viewing angle varies from 0° to 40° in 10° increments while the vertical viewing angle remains fixed at 0°. (The change in the BV curves with horizontal angle is, to first order, independent of whether the horizontal deviation is to the left or right.) Note that the regions of each curve over which gray levels would be selected almost overlie one another for the various horizontal angles. This means that gray levels chosen to be linearly spaced at zero degrees would remain very nearly linear at even high horizontal viewing angles.

The gray scale stability problem appears most predominantly when the vertical viewing angle varies. This is illustrated in FIG. 7, which shows a series of BV curves for a normally white, 90° twisted nematic display as the vertical viewing angle varies from −10° to +30° while the horizontal viewing angle remains fixed at 0°. It can be observed that for angles below 0° (measured from the normal) the BV curves shift to the right (higher voltage), and fall monotonically from their maximum but fail to reach zero.

For angles above normal, the curves shift to the left and develop a rebound after an initial minimum. These effects can be explained by considering the perspectives of viewers looking at the display from above, at, and below normal, as shown in FIG. 8. The critical feature to note is the relationship between the light traveling towards the viewer and the average liquid crystal director tilt at the center of a cell as voltage across the cell is increased.

For instance, as the voltage across a cell is increased, the average liquid crystal director in the center of the cell tilts from a parallel (with respect to the polarizer 300 and analyzer 305) orientation 815 toward a homeotropic one 825. For the viewer at normal incidence 800, retardation is highest at the nonselect state voltage and lowest at the select state voltage. When the retardation is near zero, the polarization state of the light is unchanged and it is blocked by the analyzer. Thus, the viewer sees a monotonic decrease in brightness to zero with increasing voltage.

Now consider the case of a positive vertical viewing direction (viewer above normal incidence 805). At some intermediate voltage the average director 820 points toward the viewer and the retardation is minimal. Here the viewer sees a brightness with voltage that initially decreases toward a minimum, at the point of minimal retardation, and then increases.

For the negative vertical viewing direction (viewer below normal incidence 810), the average director always presents a large anisotropy to a light ray, even at the highest voltage. The viewer therefore sees a monotonic decrease in brightness. Furthermore, the average liquid crystal director is always oriented at a larger angle with respect to the light ray for the below normal viewer 810 than it is for the normal incidence viewer 800. Therefore the anisotropy is greater and the brightness level is always higher in the negative vertical viewing direction than it is at normal incidence.

This dependency of an LCD's brightness versus viewing angle, has a profound impact on gray scale stability. In particular, the variation in gray level luminance versus vertical viewing angle can be extreme. (Note that a voltage chosen to yield a 50% gray level on the 0° curve in FIG. 7 yields a dark state on the +30° curve and approaches a fully white state at −10°.)

O-Plate Gray Scale Compensation

To eliminate reversal of gray levels and improve gray scale stability, a birefringent O-plate compensator can be used. The O-plate compensator principle, as described in U.S. patent application Ser. No. 223,251 utilizes a positive birefringent material with its principal optic axis oriented at a substantially oblique angle with respect to the plane of the display (hence the term "O-plate"). "Substantially oblique" implies an angle appreciably greater than 0° and less than 90°. O-plates have been utilized, for example, with angles relative to the plane of the display between 30° and 60°, typically at 45°. Moreover, O-plates with either uniaxial or biaxial materials can be used. O-plate compensators can be placed in a variety of locations between a LCD's polarizer layer and analyzer layer.

In general, O-plate compensators may also include A-plates and/or negative C-plates as well as O-plates. As is well known in the art, an A-plate is a birefringent layer with its extraordinary axis (i.e., its c-axis) oriented parallel to the surface of the layer. Its a-axis is thus oriented normal to the surface (parallel to the direction of normally incident light), leading to its designation as an A-plate. A-plates may be fabricated by the use of uniaxially stretched polymer films, such as polyvinyl alcohol, or other suitably oriented organic birefringent materials.

A C-plate is a uniaxial birefringent layer with its extraordinary axis oriented perpendicular to the surface of the layer (parallel to the direction of normally incident light). Negatively birefringent C-plates may be fabricated by the use of uniaxially compressed polymers (See, e.g., Clerc et at., U.S. Pat. No. 4,701,028), stretched polymer films, or by the use of physical vapor deposited inorganic thin films (See, e.g., Yeh et al., U.S. Pat. No. 5,196,953), for example.

Oblique deposition of a thin film by physical vapor deposition is known to produce a film having birefringent properties (see, e.g., Motohiro and Taga, "Thin Film Retardation Plate by Oblique Deposition," Applied Optics, Vol. 28, pp. 2466–2482, 1989). By further exploiting the tilted orientation of the symmetry axis, this process can be used to fabricate O-plates. Such components are by their nature biaxial. Their growth characteristics generate a microscopic columnar structure. The angles of the columns are tipped toward the direction of the arrival of a vapor stream. A deposition angle (measured from the surface) of 14°, for example, results in a column angle of approximately 45°. The columns develop an elliptical cross section as the result of shadowing. This elliptical cross section gives rise to the biaxial character of the films. The birefringence, in magnitude and symmetry, is entirely attributable to the film microstructure and is referred to as form birefringence. These phenomena in thin films have been extensively studied and described by Macleod ("Structure-Related Optical Properties of Thin Films," J. Vac. Sci. Technol. A, Volume 4, No. 3, pp. 418–422, 1986). In the case of a biaxial inorganic O-plate compensator, the tilt angle Θ 225 is defined by the orientation of the major axis of the O-plate's refractive index ellipsoid, and corresponds to the orientation of the microscopic columnar structure previously discussed.

FIGS. 9 and 10 show one effect that an O-plate compensator layer can have on a normally white twisted nematic display. FIG. 9 shows the O-plate compensator layer's effect on the electro-optic response of the display at various horizontal viewing angles while FIG. 10 shows the O-plate compensator layer's effect on the display's vertical viewing angle. In this particular embodiment, one A-plate layer is positioned adjacent to the liquid crystal layer on both sides of the liquid crystal cell. An O-plate layer is disposed between the polarizer layer and the A-plate/liquid crystal/A-plate stack. The variation in the BV curves versus both horizontal and vertical viewing angles are greatly reduced relative to the uncompensated case shown in FIGS. 6 and 7.

Elimination of gray scale reversal by the use of an O-plate compensator layer occurs in the following manner. In the positive vertical viewing direction, the retardation of the O-plate increases with viewing angle and tends to offset the decreasing retardation of the liquid crystal layer. When the viewer is looking down the axis of the average liquid crystal director, the presence of the O-plate prevents the layers between the two polarizers from appearing isotropic. Thus the rebound in the BV curve, shown in FIG. 7, is reduced and moved to higher voltages outside of the gray scale voltage range as shown in FIG. 10.

In the negative vertical viewing direction, the combination of an O-plate and an A-plate with their optic axes nominally at right angles tends to exhibit birefringence characteristics similar to that of a negative birefringence retarder with its optic axis oriented perpendicular to the plane containing the axes of the O-plate and A-plate. The direction of this retarder axis is nominally parallel to the orientation of the average liquid crystal in the central region of the cell when it is driven at a voltage between select and nonselect states. Thus, the presence of an O-plate oriented in this manner tends to cancel the birefringence of the liquid crystal layer, pulling the BV curve down, or equivalently, moving it toward the direction of lower voltages (i.e., left). A similar effect occurs in the positive and negative horizontal viewing directions as well.

The overall effect of introducing an O-plate compensator in this manner is to eliminate large rebounds in the gray scale voltage region and reduce the left-to-right shift in the BV curves as the viewing angle is varied from negative to positive vertical angles.

The orientations of the compensator optic axes can be carefully chosen so that the combined retardation effects cancel each other in the normal incidence viewing direction as well as minimize rebounds in the horizontal viewing direction. Combinations of more than one O-plate can be used as long as their orientations satisfy these requirements. Furthermore, negative C-plates can, for certain configurations, increase the contrast ratio at large fields of view, occasionally with some decrease in gray scale stability.

O-Plate Technology

The liquid crystal layer, the compensator layer(s), the polarizer layer, and the analyzer layer may assume a variety of orientations relative to one another in a liquid crystal display. Some of the possible configurations which have been considered, and set out in U.S. patent application Ser. No. 08/223,251, now U.S. Pat. No. 5,504,603 are repeated in Table 1; where 'A' represents an A-plate, 'C' represents a C-plate, 'O' represents an O-plate, 'LC' represents the liquid crystal, and 'O×O' represents crossed O-plates. Crossed O-plates are adjacent O-plates with their azimuthal angles Φ 235 nominally crossed, one oriented between 0° and 90°; and the second oriented between 90° and 180°.

TABLE 1

| Liquid Crystal Display Elements | | | | | | |
|---|---|---|---|---|---|---|
| ← Toward Rear (Polarizer Size) | | | | Toward Front (Analyzer Side) → | | |
| | | O | A | LC | | |
| | | A | O | LC | | |
| | | | O | LC | O | A |
| | A | O | A | LC | | |
| | | O | A | LC | A | |
| | O | A | C | LC | | |
| | | O×O | A | LC | | |
| | A | O×O | A | LC | | |
| | | | A | LC | O×O | A |
| A | O | A | C | LC | | |
| | | A | O | LC | O | A |
| | A | O | C | LC | C | O |
| | A | O | C | LC | C | O | A |
| | C | A | O | LC | O | A | C |

The projections of the principal axes onto the plane of the display with respect to the liquid crystal director can vary with the embodiment. In some cases, for example with two O-plates, the O-plate axis projections are at 45° with respect to the average liquid crystal director, while in others, the O-plate axis projection is substantially parallel with that of the liquid crystal director.

Crossed O-plate (O×O) designs that are further compensated with A-plates provide additional design flexibility. The choice of A-plate value is not critical as such designs can be adjusted by varying the relative orientations of the A-plates. Thus, it is possible to generate desired solutions with commercially available A-plate retardation values.

The flexibility which an O-plate compensation scheme offers the display designer allows tailoring of performance to specific display product requirements. It is possible, for example, with simple configuration and parameter modifications to achieve isocontrast optimized for left or right viewing, isocontrast optimized for extreme vertical angle viewing, or isocontrast optimized for viewing at both large left and right angles above normal viewing. It is also possible to adjust the configuration and parameters to improve both the contrast and gray scale stability over a specified field of view, or to further optimize one at the expense of the other. Furthermore, a negatively birefringent A-plate may be substituted for a positively birefringent A plate. In this case, the negatively birefringent A-plate would be oriented with its extraordinary axis perpendicular to the orientation appropriate for a positively birefringent A-plate. As would be understood by one skilled in the art of liquid crystal display design, additional changes would also be required in the other components of the compensator to optimize performance when a negative A-plate is used.

Summary

When viewed at an angle near the normal to its surface, a twisted nematic liquid crystal display provides high quality output, but at large viewing angles the image tends to degrade and exhibit poor contrast and gray scale nonuniformity. This occurs because the phase retardation effect of the liquid crystal material on light passing through it inherently varies with the inclination angle of the light, leading to a lower quality image at large viewing angles. By introducing one or more optical compensating elements in conjunction with the liquid crystal cell, however, it is possible to substantially correct for the undesirable angular effects and thereby maintain higher contrast and stable relative gray scale intensities at larger viewing angles than otherwise possible.

It is the goal of this invention to describe a positively birefringent inorganic thin film O-plate compensator and method to manufacture the same, that makes possible a significant improvement in the gray scale properties and contrast ratios of liquid crystal displays over a wide range of viewing angles.

SUMMARY OF THE INVENTION

An optical O-plate compensation device, in accordance with the invention, uses an inorganic thin film which is grown by physical vapor deposition at oblique incidence. The resulting thin film exhibits a biaxial form birefringence. The invention makes possible a significant improvement in the gray scale properties and contrast ratios of liquid crystal displays (LCDs) over a wide range of viewing angles.

DETAILED DESCRIPTION OF A SPECIFIC EMBODIMENT

An illustrative embodiment of the invention is described below as it might be implemented using obliquely deposited inorganic thin films to create an O-plate compensator. In the interest of clarity, not all features of an actual implementation are described in this specification. It will of course be appreciated that in the development of any such implementation (as in any development project), numerous implementation-specific decisions must be made to achieve the developers' specific goals and subgoals, such as compliance with system- and business-related constraints, which will yaw from one implementation to another. Moreover, it will be appreciated that such a development effort might be complex and time-consuming, but would nevertheless be a routine undertaking of device engineering for those of ordinary skill having the benefit of this disclosure.

For the benefit of the reader, additional detailed technical information relating to vapor deposition techniques of inorganic thin films may be found in Appendix & entitled "Fabrication of O-Plates by Physical Vapor Deposition." (Appendix A is a copy of a technical memorandum submitted by one of the inventors and is included, in its entirety, as supplemental disclosure.)

A Specific Embodiment of an O-Plate Compensator

Figure 11:
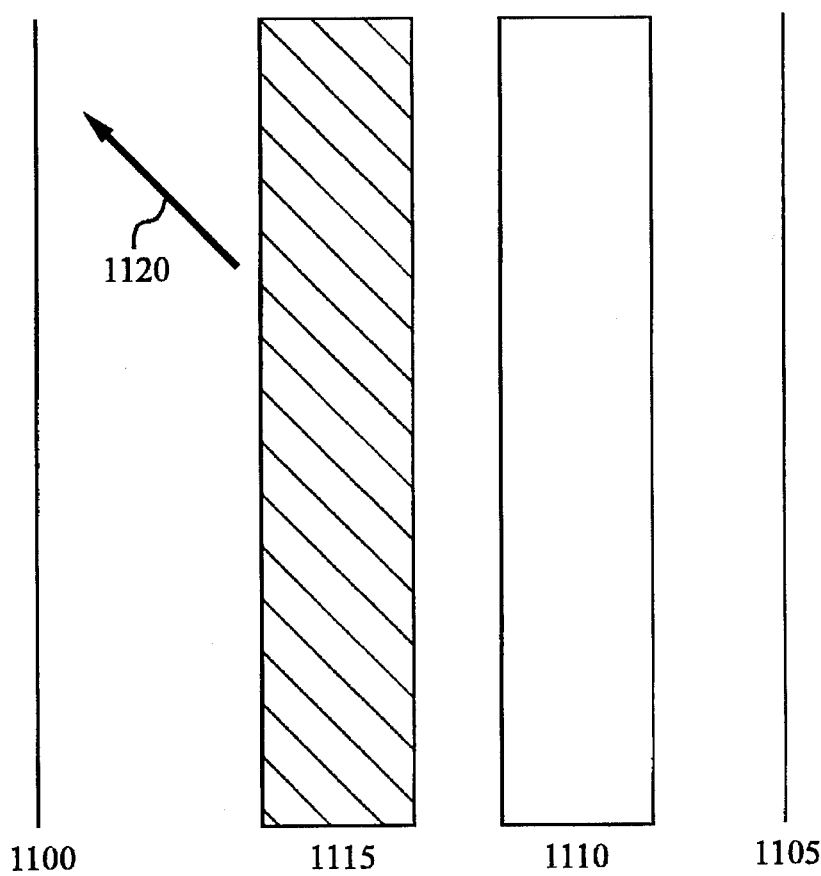
FIG. 11 is a cross-sectional view of a normally white, twisted nematic liquid crystal display in accordance with the invention.

FIG. 11 shows a cross-sectional view of a liquid crystal display including a conventional polarizer 1100, a conventional analyzer 1105 that has a transmission axis perpendicular to the transmission axis of the polarizer 1100, a conventional 90° twisted-nematic liquid crystal layer 1110, and an O-plate compensator 1115. Of course, an actual display would also include electrodes to address individual pixels on the display and perhaps other elements such as color filters (not shown). The O-plate compensator 1115 has a principal optical axis 1120, sometimes referred to in the art as an "optical symmetry axis."

Figure 12:
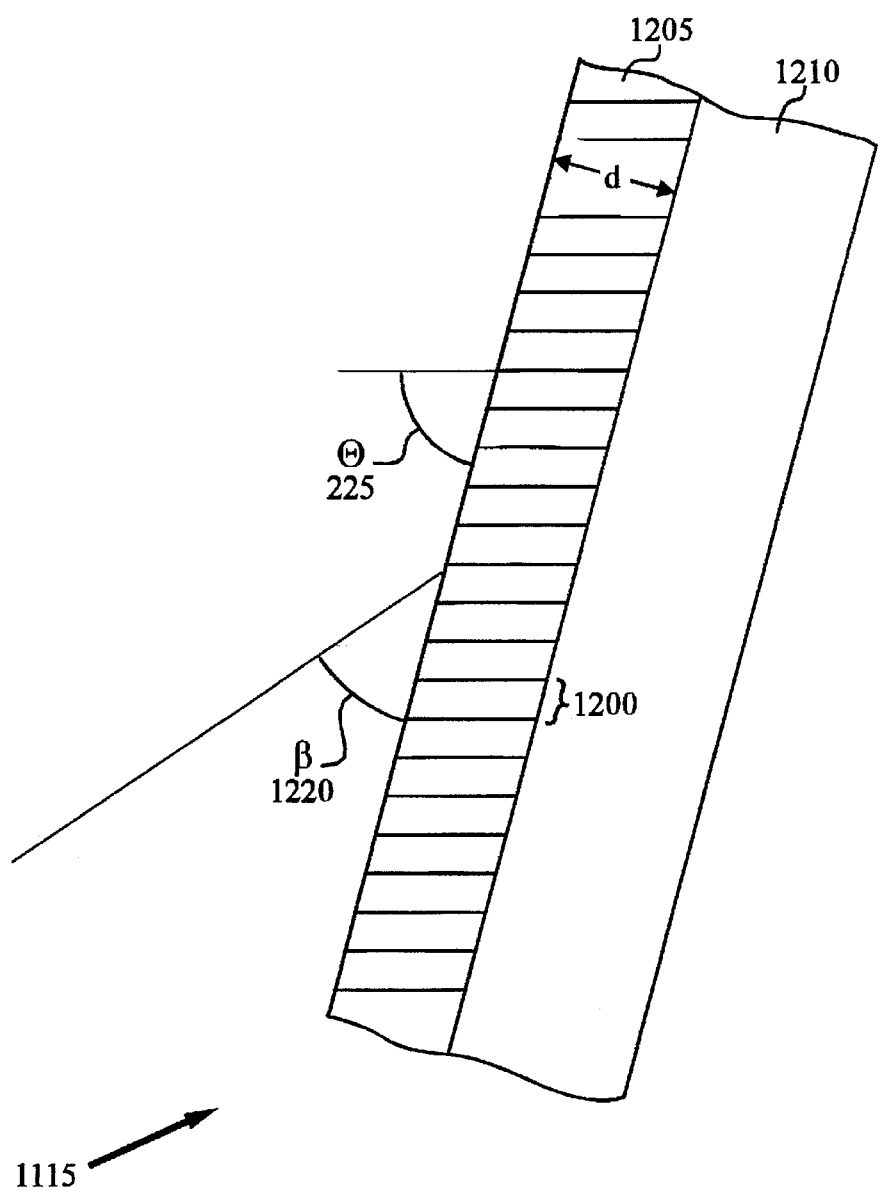
FIG. 12 is an illustrative embodiment of an inorganic thin film exhibiting a tilted columnar microstructure in accordance with the invention.

As shown in FIG. 12, the O-plate compensator 1115 includes a tilted columnar microstructure 1200 which may be formed by depositing a layer 1205 of a metal oxide (e.g., tantalum pentoxide) on a substrate 1210. It is expected that in addition to oxides of tantalum, oxides of other metals (e.g., such as Barium, Bismuth, Hafnium, Lithium, Molybdenum, Niobium, Rhenium, Titanium, Vanadium, Tungsten, Yttrium, Zirconium) will be suitable. Other materials that transmit visible light (e.g., zinc sulfide) may also be used.

The columnar microstructure 1200 is characterized by a polar tilt angle $\Theta$ 225 relative to the plane of the substrate 1210. The thickness d of the metal oxide layer 1205 should be sufficiently large to produce a positive biaxial optical anisotropy. The angle $\theta$ may be in the range of approximately 30° to approximately 60°. The microstructure 1200 produces optical anisotropy by the phenomenon of form birefringence, as discussed in the prior art, e.g., Horowitz, ("Structure-Induced Optical Anisotropy in Thin Films," Ph.D. Dissertation, University of Arizona, 1983) and Stoner ("The Demagnetizing Factor for Ellipsoids," Phil. Mag., Vol. 36, No. 803, pp. 803–821, 1945). Computation of the required thickness and selection of a tilt angle Θ for any given implementation are matters of routine engineering for those skilled in the art having the benefit of this disclosure and thus are not discussed further here.

Manufacturing Techniques

Figure 1A:
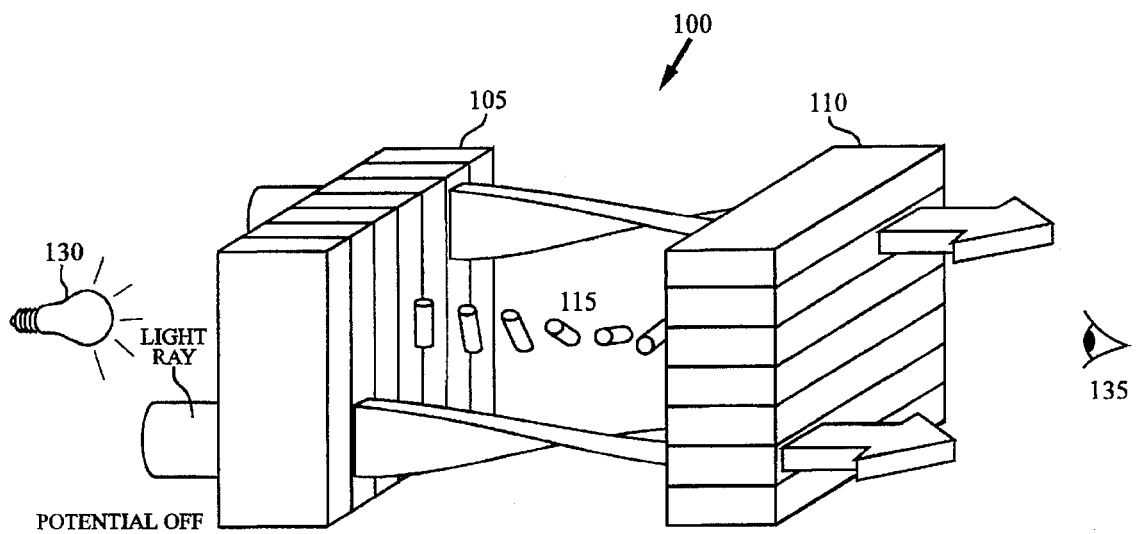
FIGS. 1A and 1B shows, in overview, the operation of a normally white, 90° twisted nematic liquid crystal display.
Figure 1B:
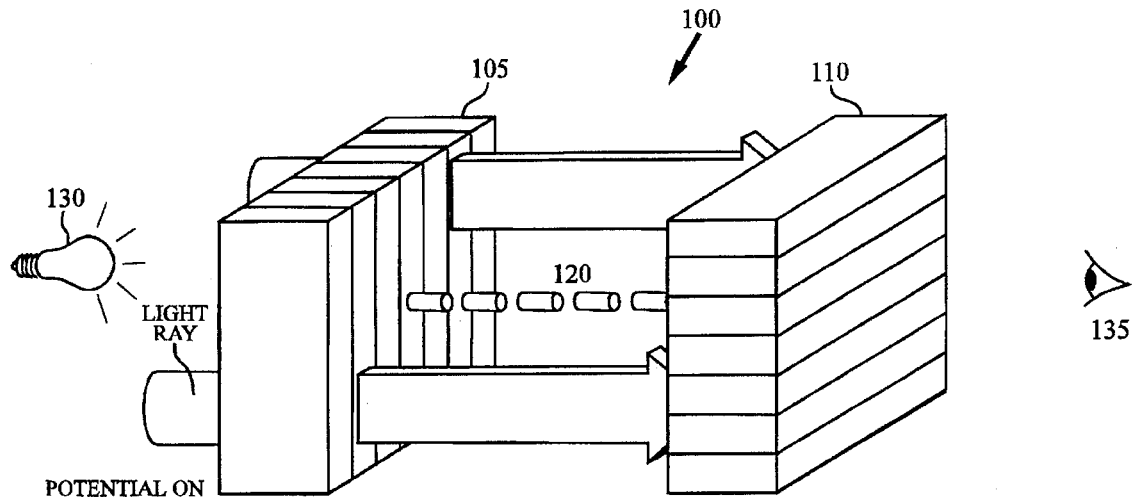
Figure 2:
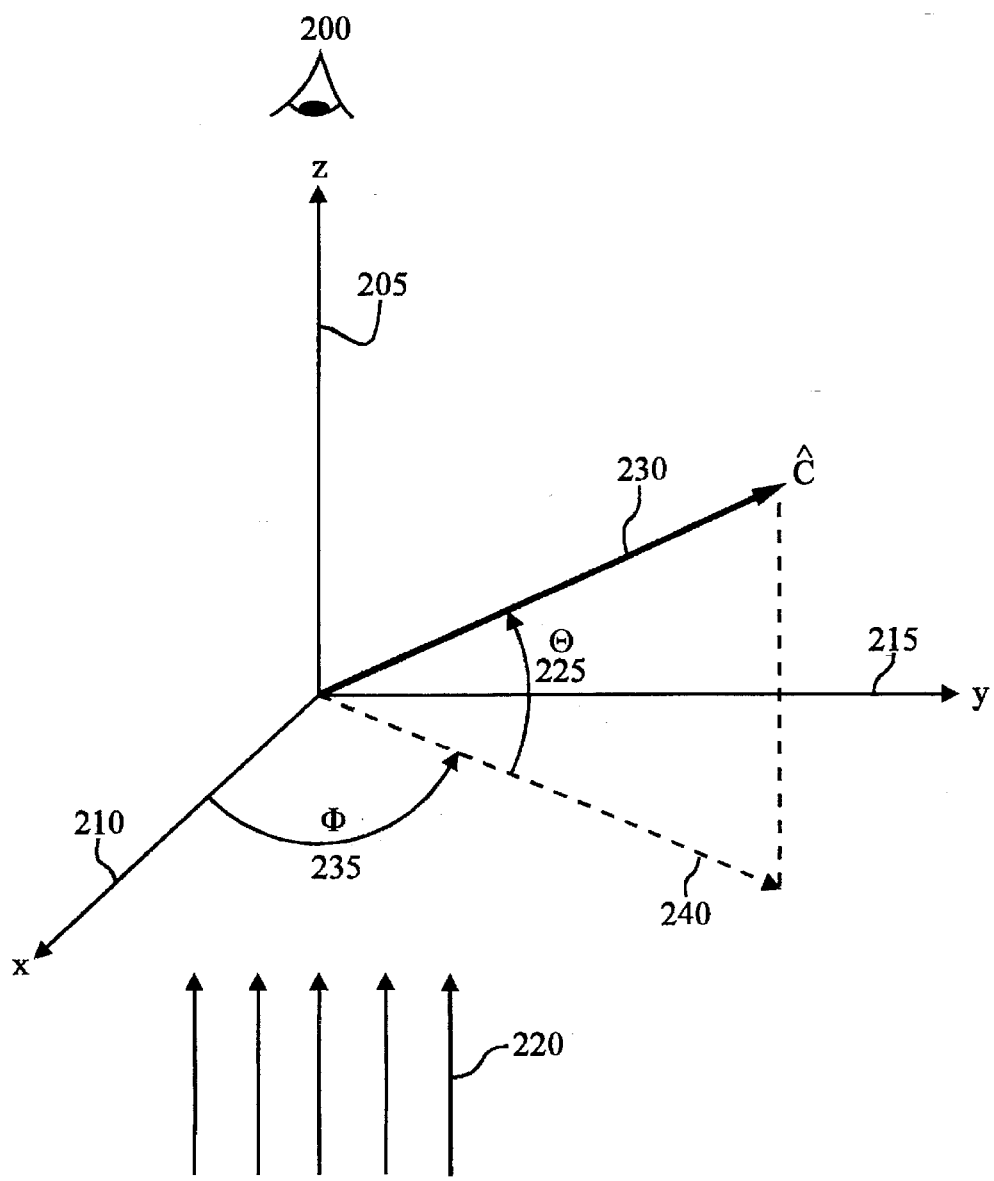
FIG. 2 depicts the coordinate system that is used to specify component orientations in the description of the invention.
Figure 3:
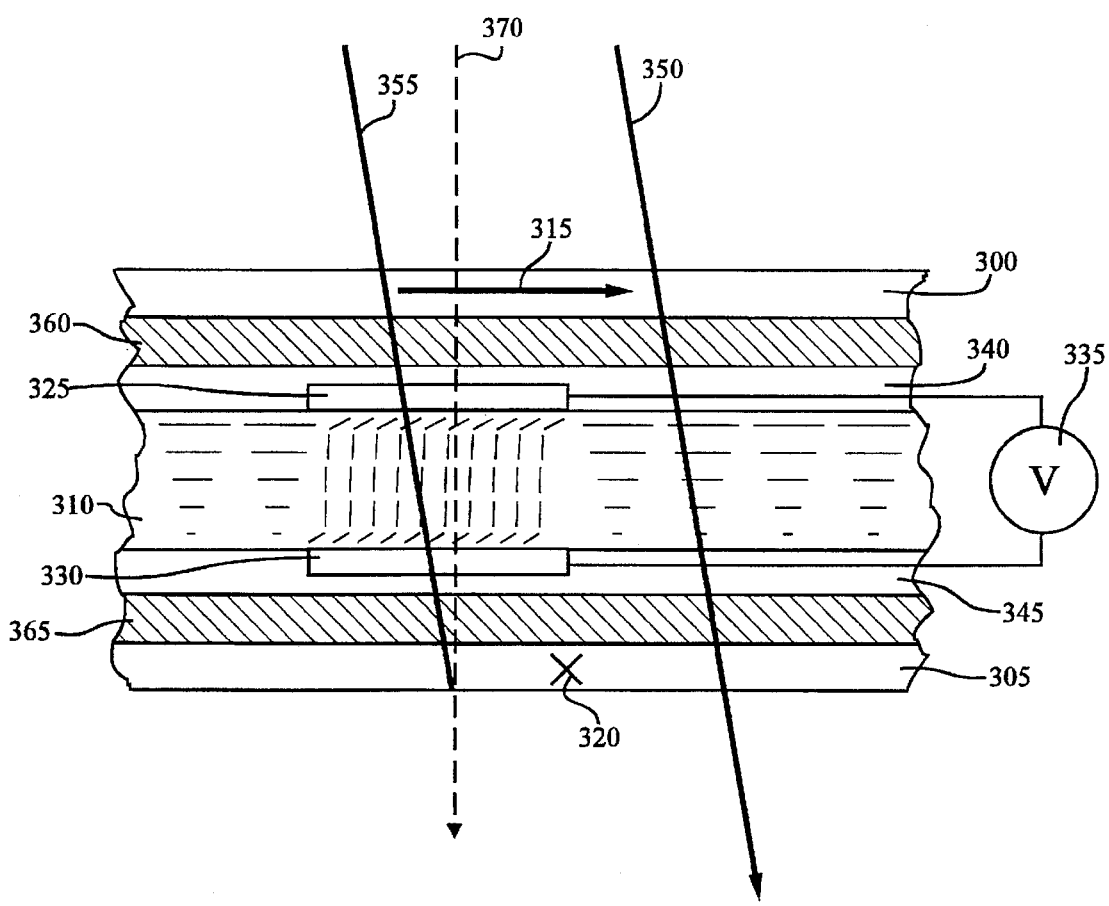
FIG. 3 is a cross sectional schematic view of a 90° twisted nematic, transmissive type normally white liquid crystal display.
Figure 4:
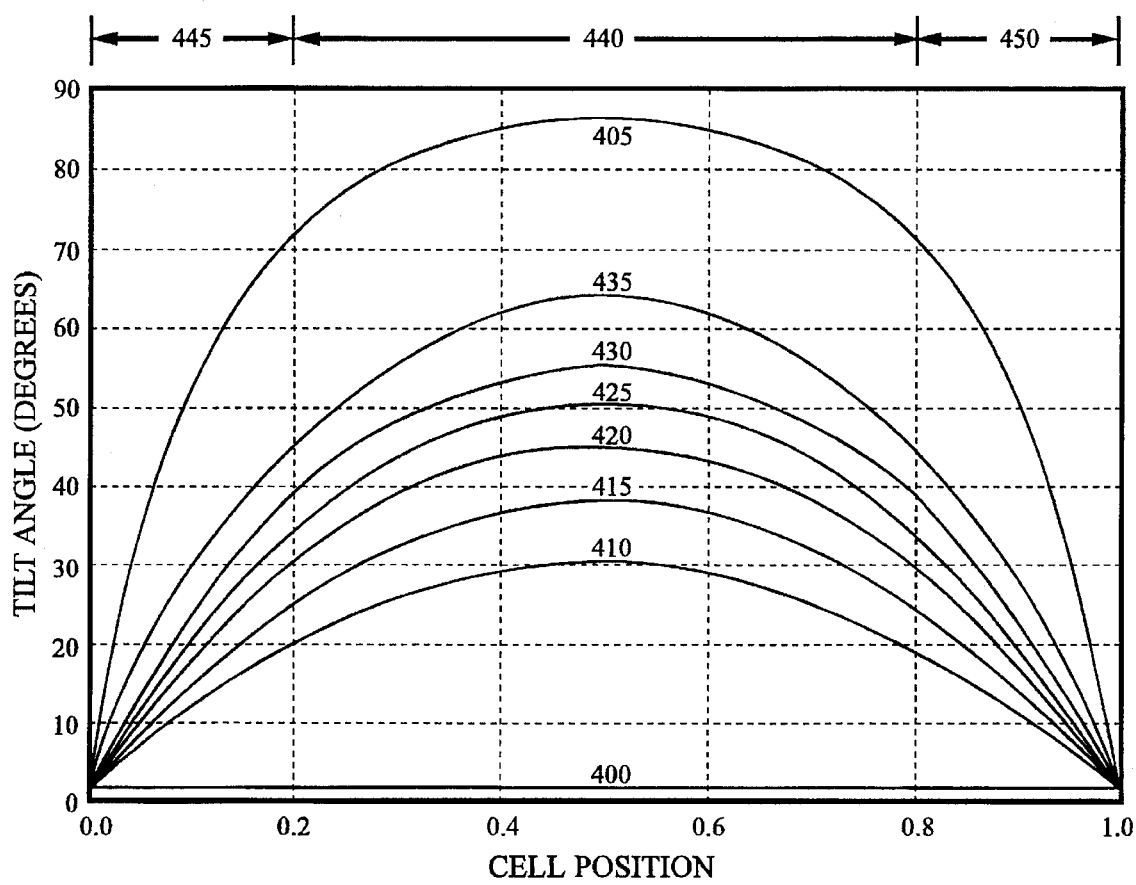
FIG. 4 is a plot of the tilt angle of the director (in degrees along the vertical axis) as a function of position (as a fraction depth along the horizontal axis) in a 90° twisted nematic liquid crystal cell.
Figure 5:
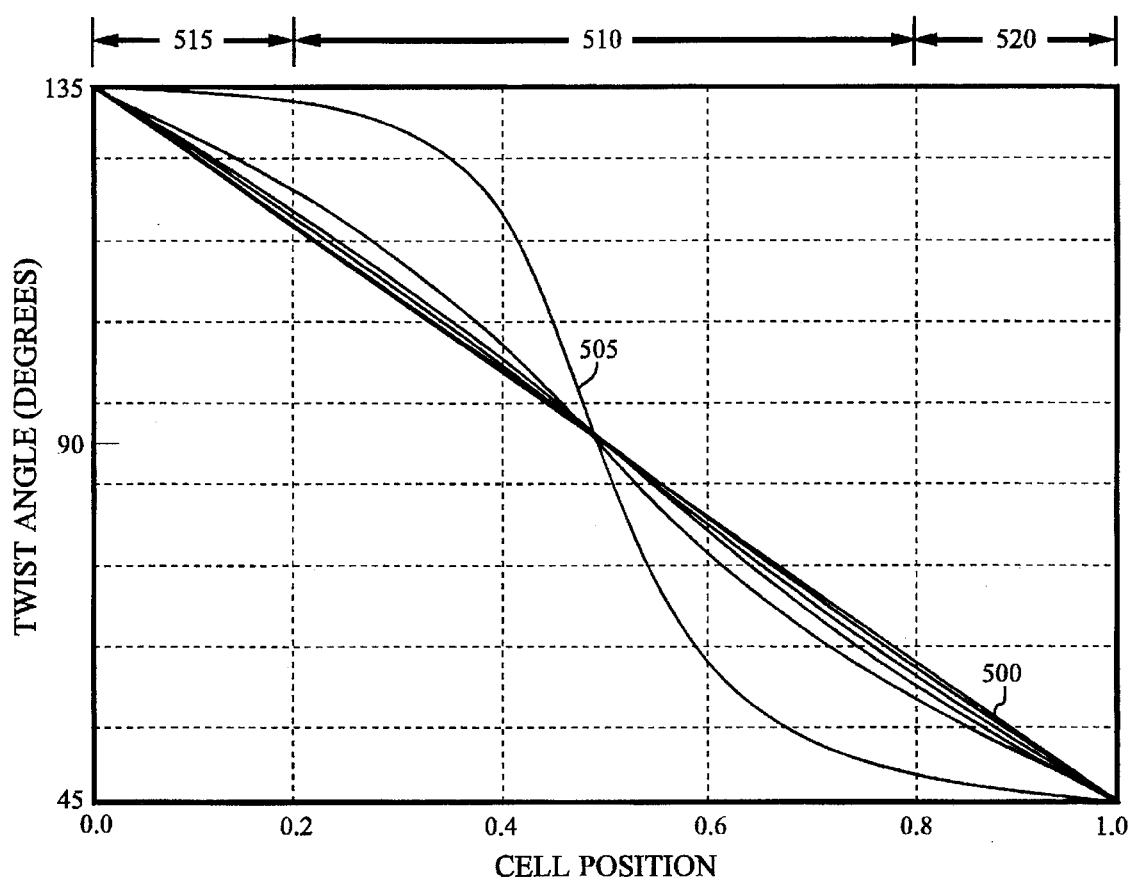
FIG. 5 is a related plot for the cell shown in FIG. 4 depicting the twist angle of liquid crystal molecules as a function of their position in the cell.
Figure 6:
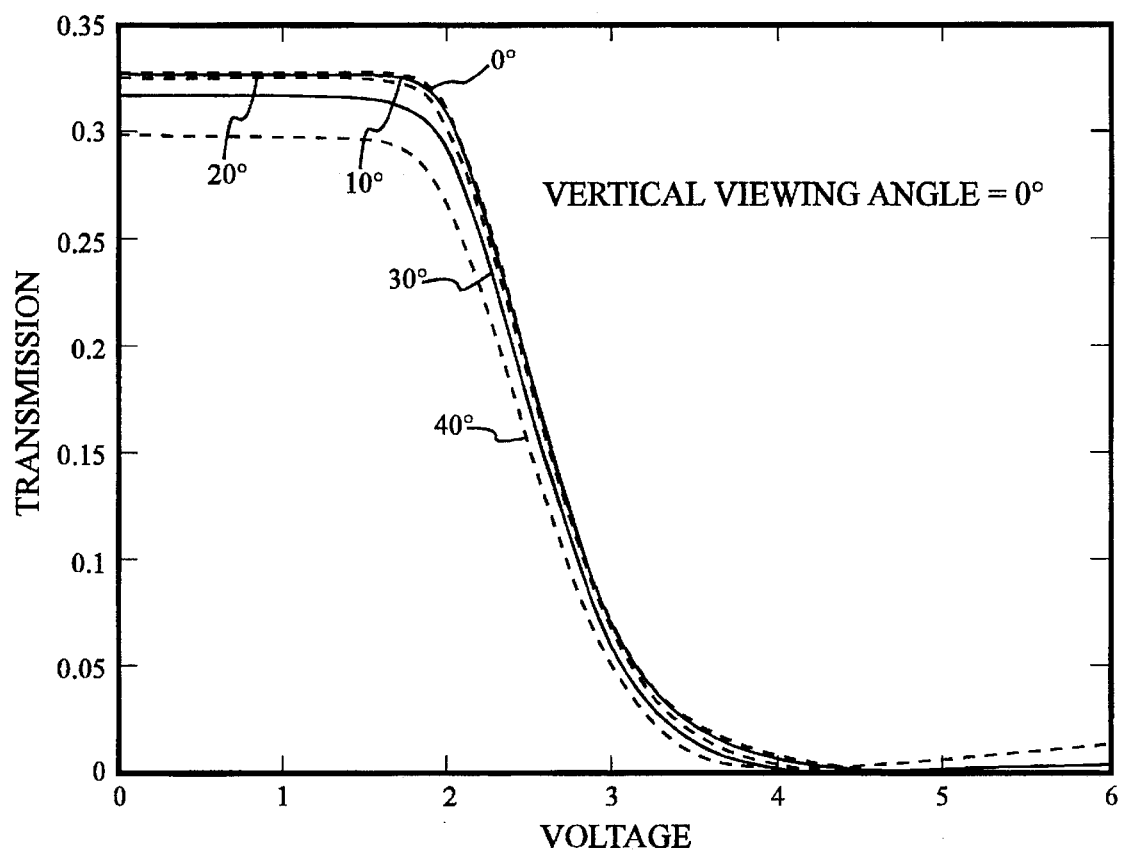
FIG. 6 is a plot of calculated brightness vs. voltage electro-optic curves at a variety of horizontal viewing directions for a typical twisted nematic display without the benefit of O-plate gray scale compensation.
Figure 7:
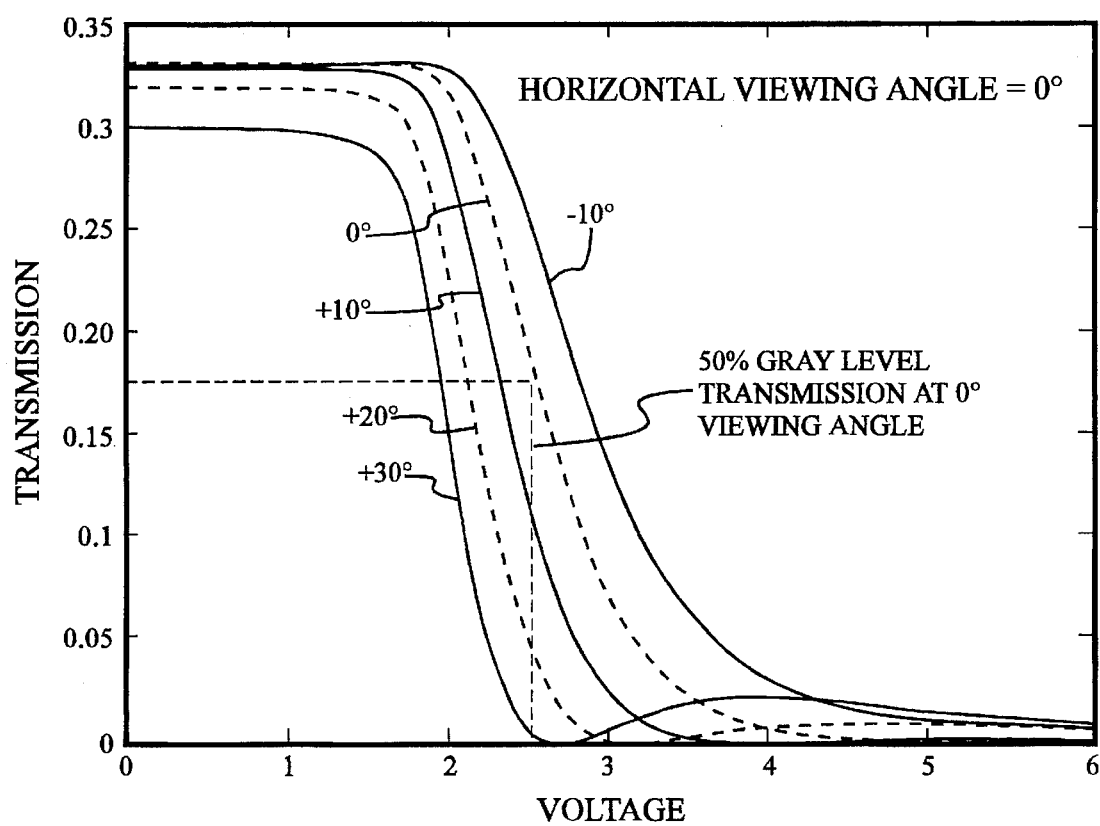
FIG. 7 is a plot of calculated brightness vs. voltage electro-optic curves at a variety of vertical viewing directions for a typical twisted nematic display without the benefit O-plate gray scale compensation.
Figure 8:
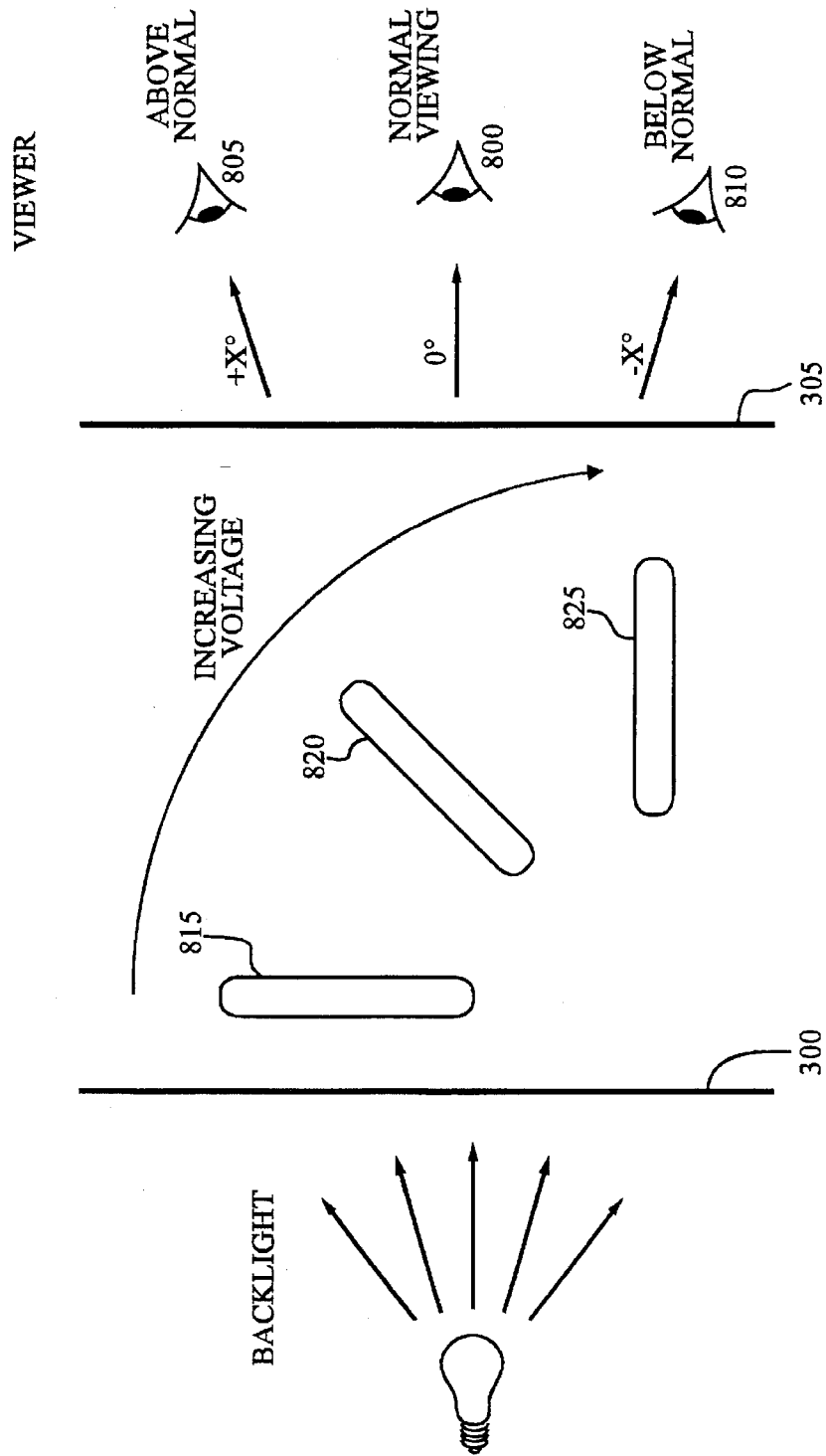
FIG. 8 is an illustration of the viewer's perspective relative to the average director orientation of a liquid crystal display.
Figure 9:
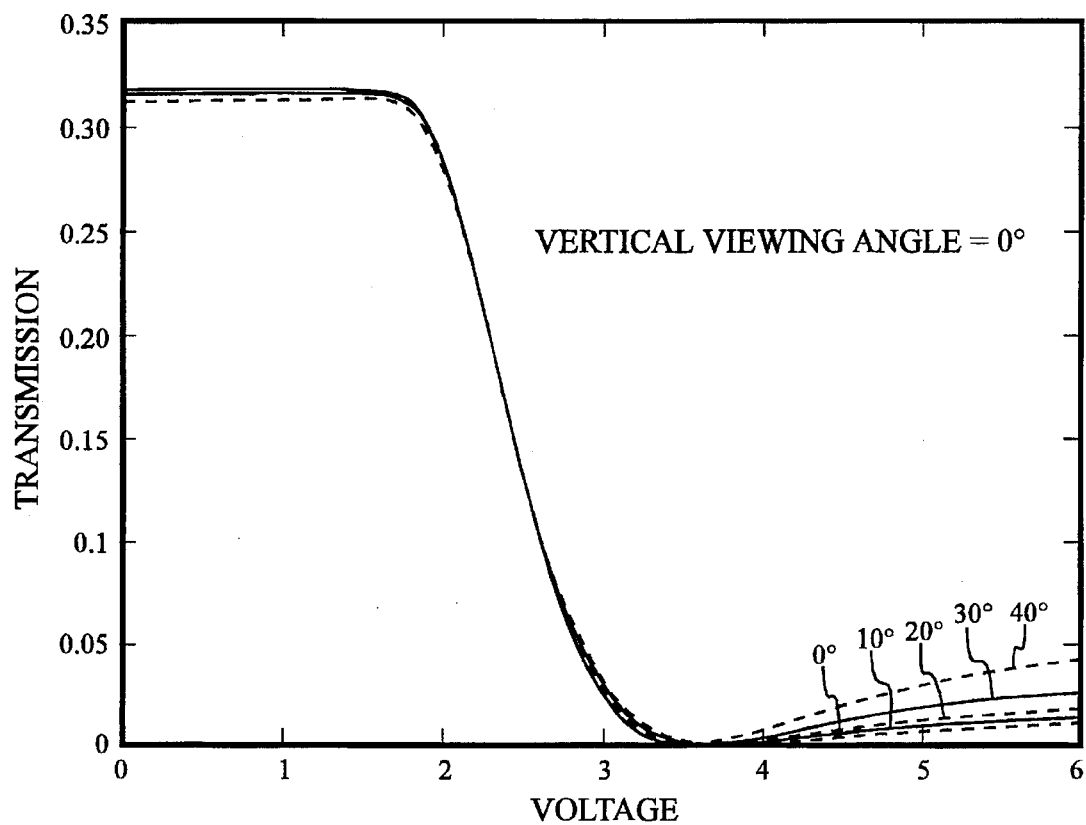
FIGS. 9 show calculated brightness vs. voltage electro-optic curves for a normally white, twisted nematic liquid crystal display, at a variety of horizontal viewing directions having the benefit of O-plate compensation in accordance with the invention.
Figure 10:
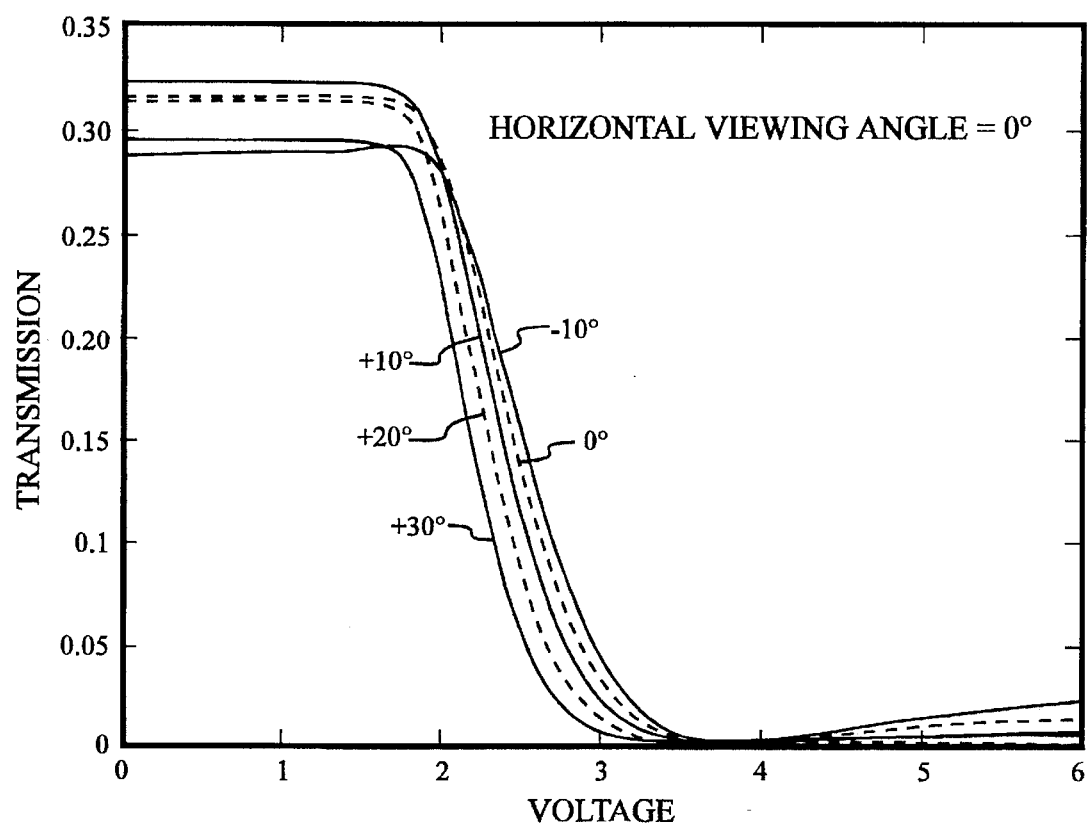
FIGS. 10 show calculated brightness vs. voltage electro-optic curves for a normally white, twisted nematic liquid crystal display, at a variety of vertical viewing directions having the benefit of O-plate compensation in accordance with the invention.
Figure 13:
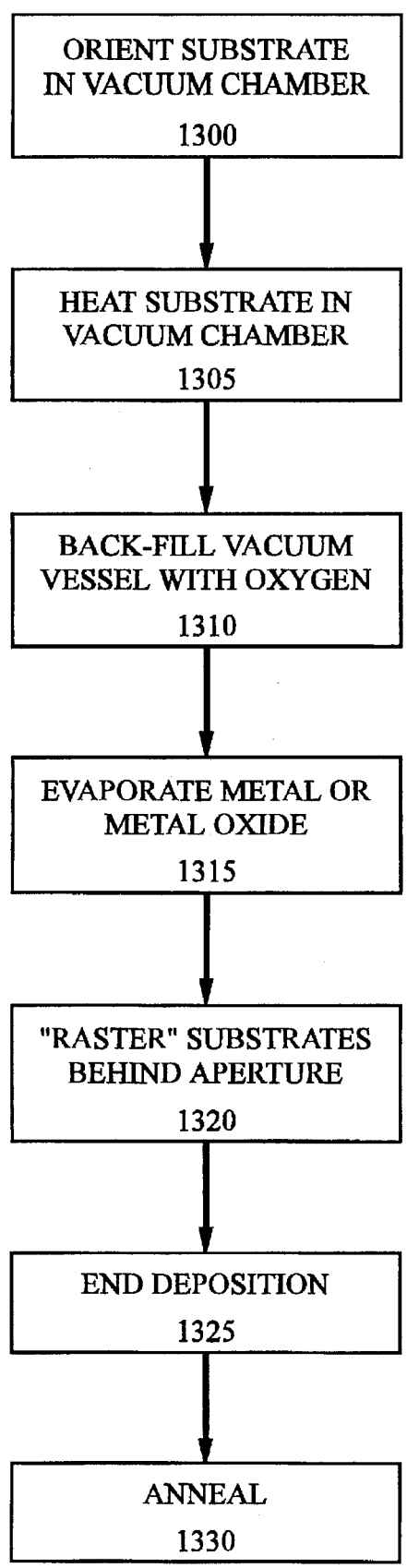
FIG. 13 is a flow-chart of an illustrative method to fabricate an inorganic thin film O-plate compensator in accordance with the invention.
Figure 14:
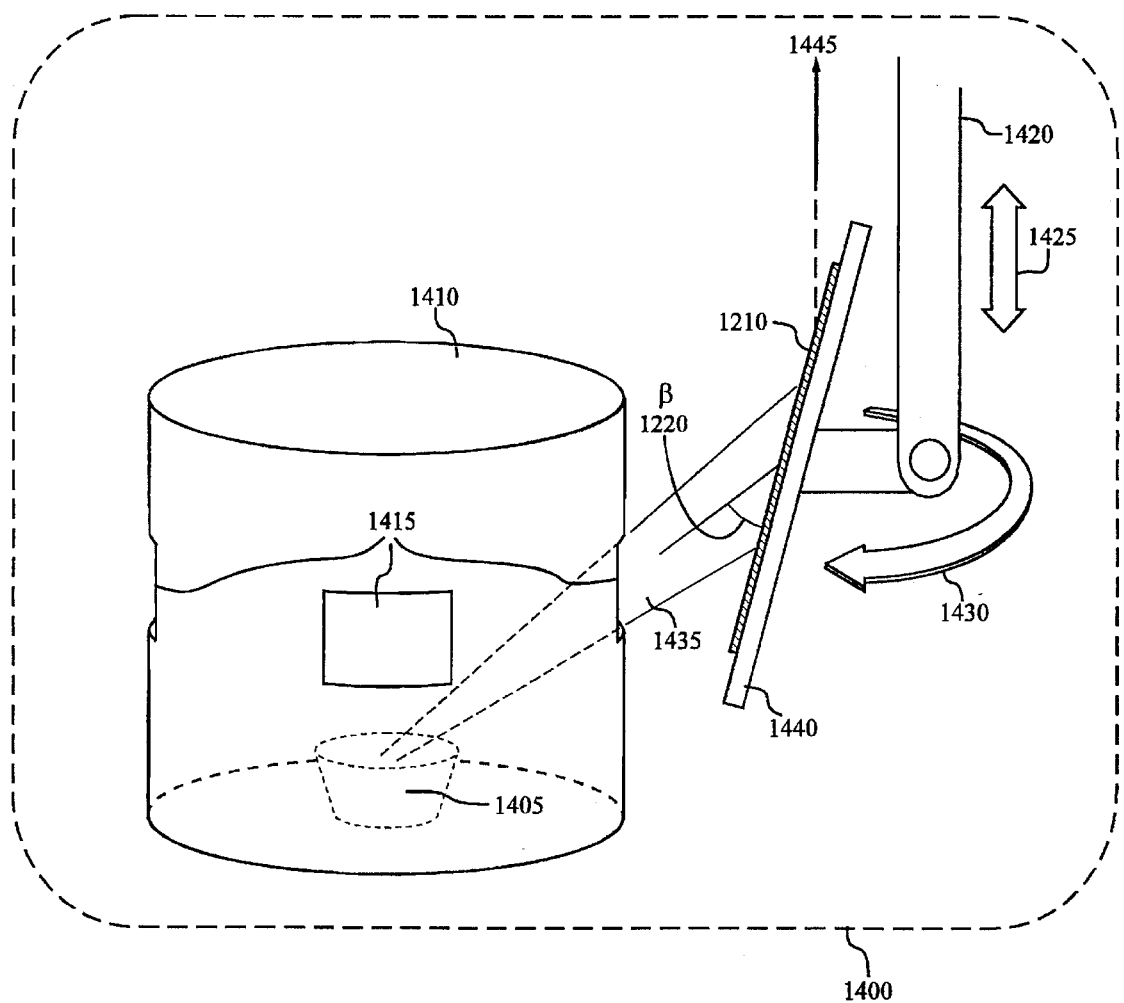
FIGS. 14 and 15 show exemplary apparatus for implementing the manufacturing process of FIG. 13.
Figure 15:
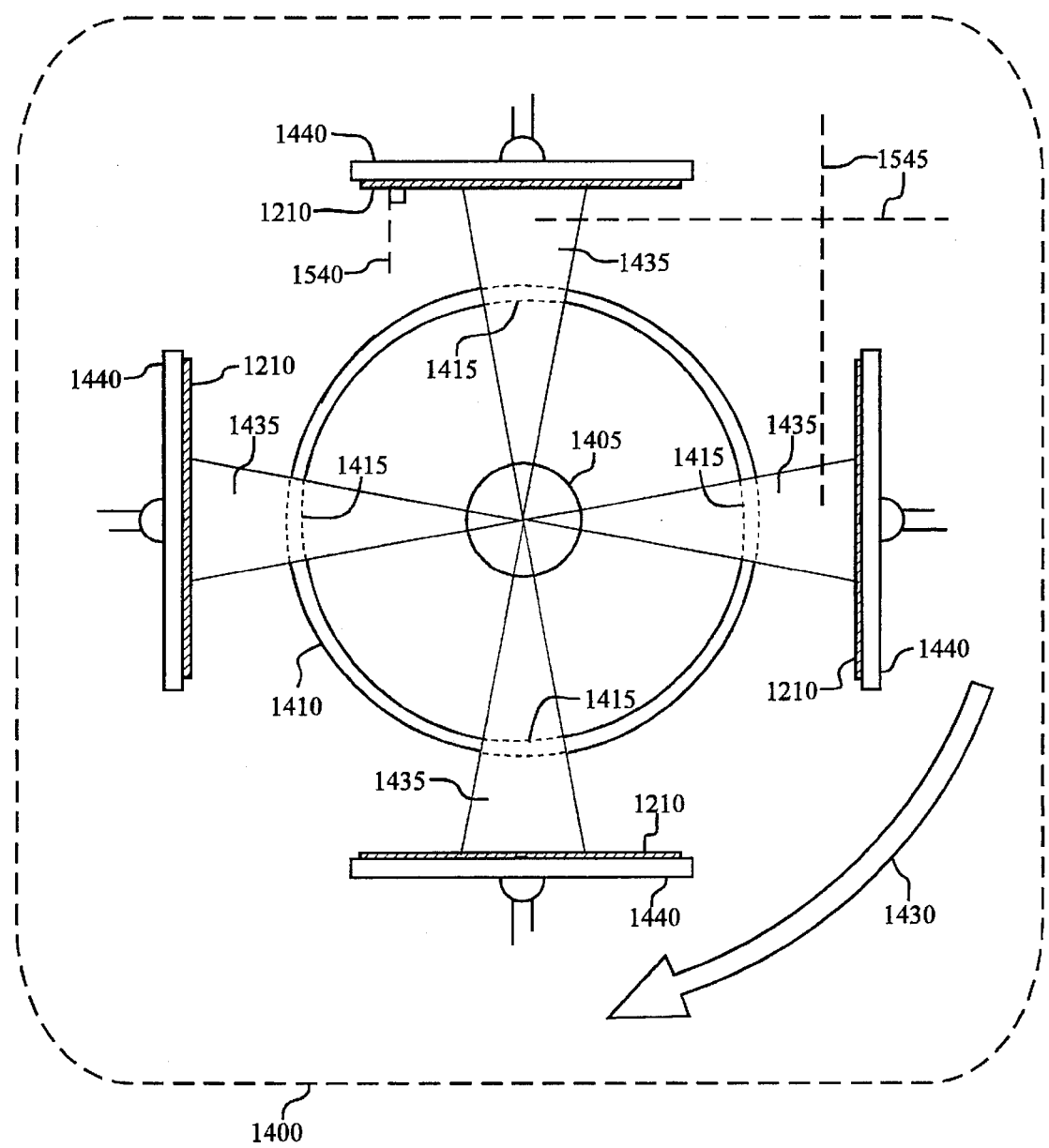

One exemplar process for manufacturing several large O-plate compensators at a time is shown in flow-chart form in FIG. 13 and utilizes equipment shown in FIGS. 14 and 15. It will be appreciated by those of ordinary skill having the benefit of this disclosure that other manufacturing techniques may be used for O-plate compensators of different sizes and configurations; one such technique can be adapted from that shown in Motohiro et al. at FIG. 1 on page 2467.

Block 1300: The substrate 1210 is positioned on a substrate holder 1440 in a conventional vacuum chamber 1400 shown in phantom in FIGS. 14 and 15. Also positioned in the vacuum chamber 1400 are a source of deposition material 1405 within a generally cylindrical mask 1410 that has a series of apertures 1415 spaced about it. The substrate 1210 is attached to a movable substrate holder 1420 that is driven by a conventional robotic device (not shown) having three degrees of freedom. The substrate is oriented in the vacuum chamber in such a way as to promote the growth of a columnar microstructure of the kind shown in FIG. 12.

Block 1305: The vacuum chamber 1400 is evacuated, and the substrate 1210 is heated to an appropriate deposition temperature. Selection of the appropriate deposition temperature will depend on factors such as the deposition material to be used and is a matter of routine engineering/ selection for those of ordinary skill.

Block 1310: Oxygen gas or some other suitable reactive gas may be introduced into the vacuum chamber 1400 by means of an appropriate pressure controller (not shown). The pressure of the reactive gas may be controlled in a conventional manner to obtain a desired refractive index and a desired optical anisotropy.

Block 1315: A source 1405 of deposition material, such as a metal or a metal oxide, is conventionally heated in the vacuum chamber 1400 to an appropriate temperature to form a vapor stream 1435. Typically, material from the source 1405 may be vaporized via a conventional electron-beam evaporation process, see Appendix A for further detailed technical information, The vapor stream 1435 passes through the apertures 1415 and impinges upon the substrate 1210 at a deposition angle β 1220.

Block 1320: The substrate 1210 is "rastered" (i.e., moved) relative to the aperture 1415 so that the vapor flow 1435 through the aperture 1415 results in a substantially uniform thickness d and deposition angle β 1220 over the substrate 1210. The rastering motion may be imparted as a combination of:

1. a vertical translation motion shown as arrow 1425,
2. a horizontal rotation about the center axis of the vacuum chamber 1400 as shown by arrow 1430, and
3. rotation about the substrate holder's vertical axis of rotation 1445 to maintain a constant orientation angle 1540 between the substrate 1210 and the direction of the vapor stream 1435 (whose direction is defined by the aperture 1415) as the substrate 1210 is rotated about the vacuum chamber 1400. (Additional positions of a substrate 1210 being rotated about the vacuum chamber 1400 are shown in phantom as dotted lines 1545.)

Block 1325: Upon completion of the deposition, the substrate 1210 (now including a tilted columnar microstructure 1200) is cooled to a temperature that allows convenient handling and then removed from the vacuum chamber 1400.

Block 1330: The substrate 1210 with its deposited microstructure 1200 is placed in a suitable oven (not shown) and annealed. Annealing temperature and time are selected to ensure a high optical transmission in the microstructure 1200.

Bibliography

1. Clerc et al., "Liquid Crystal Cell Which Can Have A Homeotropic Structure With Compensated Birefringence Of Said Structure," U.S. Pat. No. 4,701,028.
2. Horowitz, "Structure-Induced Optical Anisotropy in Thin Films," Ph.D. Dissertation, University of Arizona, 1983.
3. Kahn, "The Molecular Physics of Liquid-Crystal Devices," Physics Today, pp. 66–74, May 1982.
4. Kumaya, Yamamoto, Fujimura, and Umemoto, "A Display Substrate, A Method for Manufacturing Said Substrate, and a Liquid Crystal Display Element Using said Substrate," Japan Patent Application No. 3-114023, filed Sep. 20, 1989.
5. Macleod, "Structure-Related Optical Properties of Thin Films," J. Vac. Sci. Technol. A, Volume 4, No. 3, pp. 418–422, 1986.
6. Motohiro and Taga, "Thin Film Retardation Plate by Oblique Deposition," Applied Optics, Vol. 28, pp. 2466–2482, 1989.
7. Stoner, "The Demagnetizing Factor For Ellipsoids," Phil. Mag., Vol. 36, No. 803–821, 1945.
8. Wu and Hodgkinson, "Materials for Birefringent Coatings," Optics and Photonics News, Vol. 5, No. 5, 1994.
9. Yeh, et al., "Compensator for Liquid Crystal Display, Having Two Types of Layers with Different Refractive Indices Alternating," U.S. Pat. No. 5,196,953.

Figure 16:
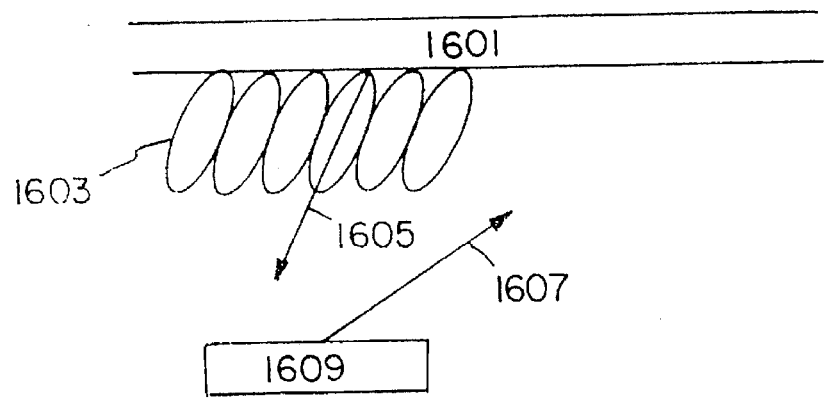
FIG. 16 illustrates geometry for growth of O-plate, showing the vapor stream, and the resulting microstructure, as well as the associated optic axis.

FIG. 16 shows a plane of device 1601, thin film with columnar microstructure 1603, optic axis 1605, vapor stream 1607 and source 1609.

Figure 17:
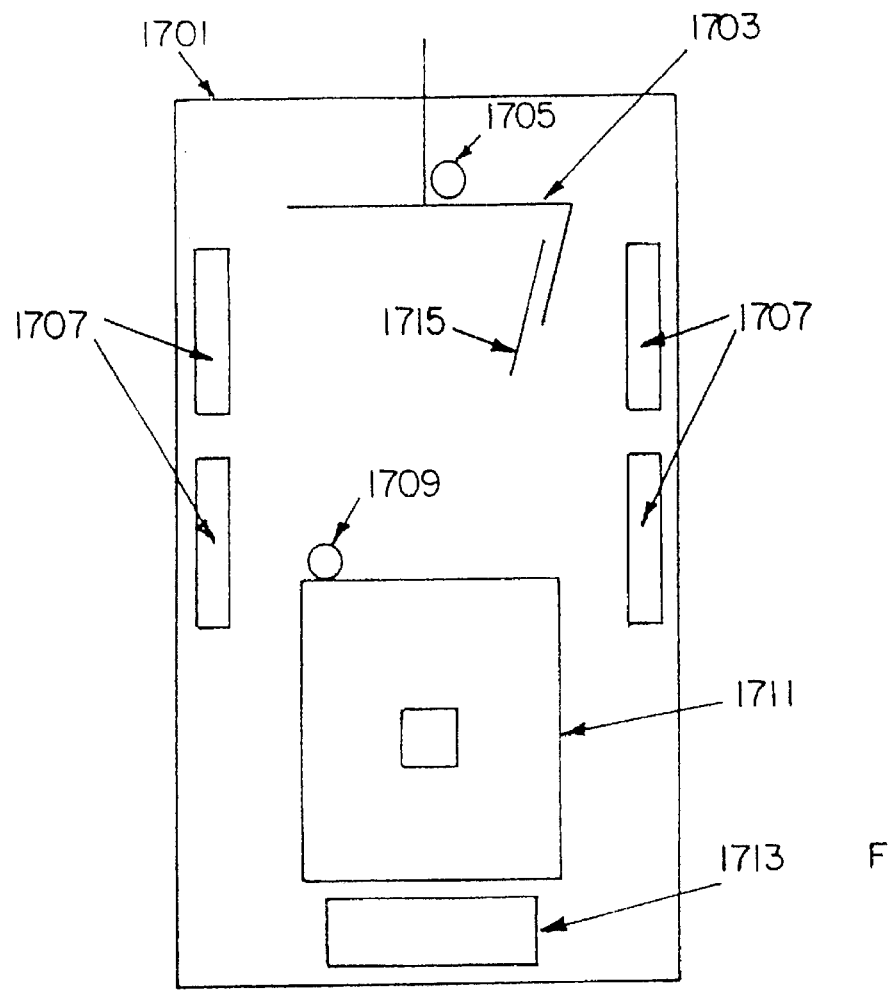
FIG. 17 is a schematic view of the deposition system used to fabricate O-plates.

FIG. 17 shows a vacuum chamber 1701, rastering substrate 1703, monitor 1705, heaters 1707, monitor 1709, aperture mask 1711, electron beam source 1713 and substrate 1715.

It will be appreciated by those of ordinary skill having the benefit of this disclosure that numerous variations from the foregoing illustration will be possible without departing from the inventive concept described herein. Accordingly, it is the claims set forth below, and not merely the foregoing illustrative embodiments, which are intended to define the exclusive rights claimed in this application program.

APPENDIX A: FABRICATION OF O-PLATES BY PHYSICAL VAPOR DEPOSITION

The Science Center has determined that the O-plate, a Rockwell invention which consists of a planar birefringent elements with its optic axes oblique to the plane of the device, can be used as a key component in TN-LCD (twisted nematic liquid crystal display) compensation architectures. O-plates are thin film devices which may be fabricated by the oblique deposition of tantalum oxide or other oxide materials. The oblique deposition method is known to produce films with columnar microstructure (FIG. 16), and its associated form birefringence [1].

Physical Vapor Deposition of Thin Films

Vapor deposited thin films are produced by condensation of material from the vapor phase under high vacuum conditions, a process known as physical vapor deposition [2]. The material in the vapor phase is, in the case of Science Center O-plates, produced by electron beam evaporation of tantalum metal or tantalum oxide source material (FIG. 17).

Because electron beam evaporation in general causes a degree of dissociation of the metal oxide, oxygen is introduced into the deposition chamber during the deposition.

Substrate temperature, background pressure, and evaporation rate may all affect the properties of the deposited thin films. The interaction of these parameters is complex and may require that tradeoff analyses be performed to achieve the required device performance. For example, it is indicated below that the conditions required to achieve nonscattering films are not optimum to produce nonabsorbing films. However, a considerable parameter space exists in which to make design trades. General rules guiding the selection of deposition conditions are summarized as follows:

Scattering.

Fills with open, loosely packed microstructures tend to be scattering, while dense films tend to be more clear. Conditions leading to dense, clear films include:

High deposition rate

Low background pressure

High deposition temperature (note: an optimum temperature may exist for some materials)

Absorption versus clarity.

Electron beam evaporated oxide fills may be absorbing due to oxygen deficiency. The degree of absorption largely depends on the ratio of deposition rate to gas pressure. Temperature may also have an effect due to temperature dependent sticking coefficients of the material. In general, conditions for nonabsorbing films are summarized as follows:

Low deposition rate

High background pressure

Temperature depends on material

Note that the pressure and rate conditions for nonscattering fills are opposite to those of nonabsorbing films.

Column angle.

This is an important parameter describing the birefringence of the O-plate. This is largely determined by the orientation of the substrate, but temperature may also have an effect. The conditions affecting the column angle are as follows:

Orientation angle. The column angle increases as the orientation angle of the substrate increases with respect to the vapor stream. A roughly linear behavior has been reported [1].

Temperature. Higher growth temperatures may lead to higher column angles.

Generally, higher deposition temperatures and lower pressures contribute to the formation of dense films. However, the combination of high oxygen pressures and/or low deposition rates contributes to the transparency of the films, requiring experimental design trades to settle in on the optimum deposition conditions. In addition, post-deposition anneals in room air may be used to clear the films by fully oxidizing the films.

The substrate deposition angle (measured from the surface of the substrate) is a key parameter in adjusting the desired birefringence. It was found that a deposition angle of 14° was optimum for these studies. Typical deposition parameters are presented in Table 1.

TABLE 1

| Deposition Conditions | |
|---|---|
| Parameter | Value |
| Substrate | Corning 7059° F. glass |
| Deposition Material | $Ta_2O_5$ |
| Base Pressure | $2-5 \times 10^{-6}$ torr |
| Reactive gas | Oxygen |
| Pressure during run | $8 \times 10^{-5}$ torr |
| Average flow rate | 10–15 sccm |
| Substrate temperature | 200° C. |
| E-beam voltage | –7.5 kV |
| E-beam current | 0.3–0.5 ma |
| Deposition rate | 0.5 to 1.0 Å/s |
| Deposition Angle | 14° |
| Post-Deposition Anneal | 60 minutes @ 250° C. |

References

1. Motohiro and Taga, *Thin film retardation plate by oblique deposition*, Appl. Opt. 28, 13 p. 2466 (1 Jul. 1989).
2. Macleod, Thin-Film Optical Filters, 2nd Ed. (Macmilan, New York, 1986) Ch. 9.
3. Nieuwenhuizen and H. B. Haanstra, Microfractography of thin films, Philips Tech. Rev. 27, 87 (1966).

What is claimed is:

1. An O-plate compensator for a liquid crystal display, said O-plate compensator comprising a tantalum oxide film having:

(a) a tilted-columnar microstructure having a tilt angle of between about 30 degrees and about 60 degrees relative to a surface of said compensator;

(b) sufficient thickness to have a positive biaxial optical anisotropy; and (c) wherein at least one of the tilt angle of the tilted-columnar microstructure and the thickness of the tantalum oxide film is selected in order to optimize performance of the liquid crystal display at wide viewing angles.

2. An O-plate compensator for a liquid crystal display, said O-plate compensator comprising an obliquely oriented inorganic microstructured film layer having a thickness and a positive optical anisotropy; wherein at least one of the orientation of the inorganic microstructured film layer, the thickness of the inorganic microstructured film layer and the positive optical anisotropy of the inorganic microstructured film are selected in order to optimize performance at wide viewing angles of the liquid crystal display.

3. The compensator of claim 2, wherein the inorganic microstructured film layer comprises a tilted columnar microstructure.

4. The compensator of claim 3, wherein said tilted columnar microstructure has a tilt of between about 30 degrees and about 60 degrees relative to a surface of said compensator.

5. The compensator of claim 2, wherein the inorganic microstructured film layer comprises a metal oxide.

6. The compensator of claim 5, wherein said metal oxide is a tantalum oxide.

7. A liquid crystal display for viewing at various angles with respect to a normal axis perpendicular to the display, comprising:

(a) a polarizer layer;

(b) an analyzer layer;

(c) a liquid crystal layer disposed between the polarizer layer and the analyzer layer;

(d) a first electrode proximate to a first major surface of the liquid crystal layer;

(e) a second electrode proximate to a second major surface of the liquid crystal layer, the first and second electrodes being adapted to apply a voltage across the liquid crystal layer when the electrodes are connected to a source of electrical potential; and (f) an O-plate compensator, disposed between the polarizer layer and the analyzer layer, in accordance with a specified one of claims 1, 2, 3, 4, 5, and 6.

8. A method of manufacturing an O-plate compensator, comprising the steps of:

(a) providing a substrate;

(b) providing a mask having an aperture;

(c) providing a source of an inorganic deposition material comprising tantalum or a tantalum oxide;

(d) positioning said substrate and said source on opposite sides of said aperture to provide an oblique deposition angle between said source and said substrate;

(e) heating said source in a substantial vacuum to form a vapor;

(f) providing an oxygen gas to react with said vapor;

(g) applying a combination of a rotation motion, a translation motion, and a nutation motion to said substrate to obtain a substantially uniform thickness and deposition angle over said substrate;

(h) controlling one or more of (1) a temperature of said substrate, (2) a rate of deposition on said substrate, and (3) a pressure of said oxygen gas, to obtain a desired refractive index and a desired optical anisotropy; and (i) annealing said inorganic microstructured film layer.

9. A method of manufacturing an O-plate compensator, comprising the steps of:

(a) providing a substrate;

(b) depositing an inorganic microstructured film layer at an incidence angle oblique to a surface of said substrate.

10. The method of claim 9, wherein said step (b) of depositing an inorganic microstructured film layer comprises the substeps of:

(1) providing a mask having an aperture;

(2) providing a source of an inorganic deposition material;

(3) positioning said substrate and said source on opposite sides of said aperture to provide an oblique deposition angle between said source and said substrate;

(4) heating or sputtering said source in a substantial vacuum to form a vapor;

(5) providing a reactive gas to react with said vapor to form said inorganic microstructured film layer; and (6) applying a relative motion between said substrate and said source to obtain a substantially uniform thickness and deposition angle over said substrate.

11. The method of claim 10, further comprising the substeps of controlling one or more of (A) a temperature of said substrate, and (B) a rate of deposition of said vapor on said substrate, to obtain a desired refractive index and optical anisotropy.

12. The method of claim 10, wherein said deposition material is a metal or a metal oxide and said reactive gas comprises oxygen.

13. The method of claim 12, wherein said metal is tantalum and said metal oxide is a tantalum oxide.

14. The method of claim 10, further comprising the substep of controlling the pressure of said reactive gas to obtain a desired refractive index and optical anisotropy.

15. The method of claim 10, wherein said substep (5) of applying a relative motion comprises applying one or more of a rotation motion, a translation motion, and a nutation motion to said substrate.

16. The method of a specified one of claims 9, 10, 11, 12, 13, and 14, further comprising the step of annealing said inorganic microstructured film layer.

17. A method of manufacturing an O-plate compensator, comprising the steps of:

(a) providing a substrate;

(b) depositing an inorganic microstructured film layer at an incidence angle oblique to a surface of said substrate, wherein the step of depositing an inorganic microstructured film layer comprises the substeps of:

(1) providing a mask having an aperture;

(2) providing a source of an inorganic deposition material, the deposition material being a metal;

(3) positioning said substrate and said source on opposite sides of said aperture to provide an oblique deposition angle between said source and said substrate;

(4) heating or sputtering said source in a substantial vacuum to form a vapor;

(5) providing a reactive gas to react with said vapor to form said inorganic microstructured film layer; and (6) applying a relative motion between said substrate and said source to obtain a substantially uniform thickness and deposition angle over said substrate.

18. The method of claim 17, further comprising the substeps of controlling one or more of (A) a temperature of said substrate, and (B) a rate of deposition of said vapor on said substrate, to obtain a desired refractive index and optical anisotropy.

19. The method of claim 17, wherein said deposition material is a metal or a metal oxide and said reactive gas comprises oxygen.

20. The method of claim 19, wherein said metal is tantalum and said metal oxide is a tantalum oxide.

21. The method of claim 17, further comprising the substep of controlling the pressure of said reactive gas to obtain a desired refractive index and optical anisotropy.

22. The method of claim 17, and further comprising the step of annealing said inorganic microstructured film layer.

23. A method of manufacturing an O-plate compensator, comprising the steps of:

(a) providing a substrate;

(b) depositing an inorganic microstructured film layer at an incidence angle oblique to a surface of said substrate, wherein the step of depositing an inorganic microstructured film layer comprises the substeps of:

(1) providing a mask having an aperture;

(2) providing a source of an inorganic deposition material;

(3) positioning said substrate and said source on opposite sides of said aperture to provide an oblique deposition angle between said source and said substrate;

(4) heating or sputtering said source in a substantial vacuum to form a vapor; and (5) applying a relative motion between said substrate and said source to obtain a substantially uniform thickness and deposition angle over said substrate, wherein applying a relative motion comprises applying one or more of a rotation motion, a translation motion, and a nutation motion to said substrate.

* * * * *